(12) United States Patent
Xiao et al.

(10) Patent No.: US 6,949,403 B2
(45) Date of Patent: Sep. 27, 2005

(54) NON-VACUUM METHODS FOR THE FABRICATION OF ORGANIC SEMICONDUCTOR DEVICES

(75) Inventors: Steven Shuyong Xiao, Laval (CA); Chunong Qiu, Brossard (CA); Cindy Xing Qiu, Brossard (CA)

(73) Assignee: Organic Vision Inc., Brossard (CA)

( * ) Notice: Subject to any disclaimer, the term of this patent is extended or adjusted under 35 U.S.C. 154(b) by 70 days.

(21) Appl. No.: 10/624,003

(22) Filed: Jul. 22, 2003

(65) Prior Publication Data

US 2005/0019976 A1 Jan. 27, 2005

(51) Int. Cl.$^7$ .............................................. H01L 51/40
(52) U.S. Cl. ....................................... 438/99; 438/237
(58) Field of Search ........................... 438/29, 30, 99, 438/149, 164, 237, 328; 349/106, 108; 359/108; 427/466, 469

(56) References Cited

U.S. PATENT DOCUMENTS

| | | | | |
|---|---|---|---|---|
| 5,833,820 A | * | 11/1998 | Dubin | ..................... 204/212 |
| 5,869,929 A | * | 2/1999 | Eida et al. | ................... 313/501 |
| 6,087,196 A | * | 7/2000 | Strum et al. | ................... 438/29 |
| 6,344,662 B1 | * | 2/2002 | Dimitrakopoulos et al. | .. 257/40 |
| 6,414,431 B1 | * | 7/2002 | Yu et al. | ....................... 313/504 |
| 6,503,831 B2 | * | 1/2003 | Speakman | ................... 438/674 |
| 6,891,330 B2 | * | 5/2005 | Duggal et al. | ............... 313/511 |

OTHER PUBLICATIONS

J.H. Burroughes, C.A. Jones, and R.H. Friend, Nature, 335, 137(1988).
C.W.Tang and S.A. Van Slyke, Applied Physics Letter, 51, 913(1988).
M. Pfeiffer, S.R. Forrest, K. Leo and M.E. Thompson, Advanced Materials, 14(2), 1633(2002).
J.H. Burroughes, et al, Nature 347, 539 (1990).
A.Yasude, et al, EP1 149 827, 2001.

* cited by examiner

Primary Examiner—Asok Kumar Sarkar

(57) ABSTRACT

This invention discloses methods for the fabrication of organic semiconductor material-based devices under non-vacuum environment. In one embodiment, electrodes are formed by electrodeposition from an electrolyte containing ions or complexes of the electrode materials to be deposited. In another embodiment, electrodes are formed by solution processing from a solution (or ink) containing nano-particle of the electrode materials or the precursor of electrode materials to be deposited. In addition, two different modes, either layer by layer or layer to layer, are disclosed for the fabrication of organic semiconductor material-based devices, wherein all semiconductor organic materials required by the function of the desired device are deposited under an non-vacuum environment.

8 Claims, 7 Drawing Sheets

NON-VACUUM METHODS FOR THE FABRICATION OF ORGANIC SEMICONDUCTOR DEVICES

FIELD OF THE INVENTION

This invention relates to the fabrication methods of organic devices under non-vacuum environment. It also relates to the fabrication of electrodes by an electrodeposition method and an electroless method, and to the fabrication of electrodes by solution processing methods.

BACKGROUND OF THE INVENTION

Organic materials with controlled structures may have electronic and opto-electronic properties similar to inorganic semiconductor materials and are suitable for the fabrication of electronic and opto-electronic devices [J. H. Burroughes, C. A. Jones, and R. H. Friend, "New Semiconductor Device Physics in Polymer Diodes and Transistors," *Nature*, 335, 137(1988)]. The organic semiconductor devices which have been investigated recently include but not limited to organic thin film transistor, organic photo-voltaic for solar electricity or photo-detector, organic solid state laser or organic solid state lighting, organic thin film memory for data storage, organic sensor for bio-application and chemical detection, and organic light emitting diode for flat panel applications.

Due to chemical nature, these electro-opto active organic semiconductor compounds are classified into two general categories: small molecules or macromolecules. Examples of small molecules include Alq3 [C. W. Tang and S. A. Van Slyke, "Organic Electroluminescent Diodes," *Applied Physics Letter*, 51, 913(1988)], Irppy [M. Pfeiffer, S. R. Forrest, K. Leo and M. E. Thompson, "Electrophosphorescent p-i-n Organic Light-Emitting Devices for Very High Efficiency Flat Panel Displays," *Advanced Materials*, 14(2), 1633 (2002)], etc. which have been employed as light emitting materials or charge transporting materials in the fabrication of organic light emitting device (OLED), and the devices based on these small molecules are specifically referred to as SMOLEDs. Similarly, macromolecules such as poly(p-phenylene vinylene (PPV) [J. H. Burroughes, D. D. C. Bradley, A. R. Brown, R. N. Marks, K. Mackay, R. H. Friend, P. L. Burns, and A. B. Holmes, "Light-Emitting Diodes Based on Conjugated Polymers," *Nature* 347, 539 (1990)], polyfluorenes (PF) [A. Yasude, W. Knoll, A. Meisel, T. Miteva, D. Neher, H. G. Nothofer, and U. Scherf, "End-capped polyfluorenes, films and devices based thereon," EPI 149 827, 2001], polyvinylcarbazole (PVK), polythiophenes (PT), etc. have been also employed as light emitting materials or charge transporting materials in the fabrication of OLEDs. The devices based on these polymers are specifically referred as PLEDs. For SMOLEDs, the organic semiconductor materials are normally deposited by a vacuum deposition method, also called a dry-vacuum processing in general. For PLEDs, the organic semiconductor polymers are deposited by spin coating, ink jet printing or screen printing, also called a wet-solution processing in general. Of the two OLED technologies, the industry considers polymer-based one to be a more viable solution because of the potentially lower manufacturing costs and greater processing flexibility. The main advantage of polymeric materials is that they can be deposited by simple solution processing techniques such as spin coating, inkjet printing and other conventional printing methods, which require relatively inexpensive equipment than the dry-vacuum processing. If organic semiconductor devices and circuits can be fabricated using the simple solution processing techniques, then low cost electronic and opto-electronic units and systems will be available in the future.

However, such an advantage in the fabrication of polymer-based devices (PLED for example) comparing to that of small molecular-based devices (SMOLED for example) has not been realized yet in industry. This is mainly due to the difficulty in fabricating good quality electrodes. In order to make an organic semiconductor device, electrodes must be deposited onto the organic semiconductor materials. Currently, no matter if the organic semiconductor devices are prepared from small molecules or polymers, their contact electrodes are still practically deposited by vacuum methods such as vacuum thermal evaporation, vacuum sputtering, chemical vapour deposition and others.

The requirements for electrode fabrication using the vacuum methods make the fabrication of polymer-based organic semiconductor devices to be even more complicated. For instance in making PLEDs, after the organic semiconductor materials have been deposited by a wet-solution method, the sample has to be transferred to a dry-vacuum environment for the deposition of contact electrodes. An integration of a wet environment and a dry-vacuum environment required in the current fabrication method is expensive and complicated.

Furthermore, in order to facilitate the charge injection in an organic semiconductor device, a low work function metallic layer is often used as cathode. One example is in an organic light-emitting device (OLED), where a low work function metal electrode such as Ca, Mg, Li and alloys must be deposited in order to achieve efficient charge injection. During operation, the low work function materials will allow a large injection rate of electrons into the organic semiconductor to increase the charge injection efficiency. Due to the chemical reactivity, most of the low work function materials are very active when exposed to an environment containing oxygen and water. These materials can form oxides or hydrides rapidly even at room temperature. Therefore, the fabrication of organic devices involving the low work function materials is even more difficult to achieve without a high vacuum. As mentioned before, it is rather expensive to set-up and to maintain a high vacuum system for the deposition of the low work function electrodes. This is especially true for large-scale production of these organic semiconductor devices for circuit applications. From the above comments, it is clear that it is highly desirable to have an organic device where the electrodes, specifically the ones with low work functions, are fabricated using a method other than vacuum deposition.

OBJECT OF THE INVENTION

One objective of this invention is to describe a method to deposit a low work function metal or metallic alloy onto a substrate for the fabrication an organic semiconductor device without the requirement of vacuum.

Another objective of this invention is to describe a method to deposit a high work function material onto a substrate for the fabrication an organic semiconductor device without the requirement of vacuum.

Yet another objective of this invention is to teach processing techniques of completely non-vacuum for the fabrication of OLEDs and other organic semiconductor devices and circuits by employing the electrode fabrication methods according to this invention.

DETAILED DESCRIPTION OF THE PREFERRED EMBODIMENTS

Two different methods are disclosed in this invention for the fabrication of an electrode without the need of vacuum deposition process. Specifically, the low work function electrode is preferably formed by an electrodeposition technique, whereas, the high wok function electrode is preferably formed by a printing technique.

Figure 1A:
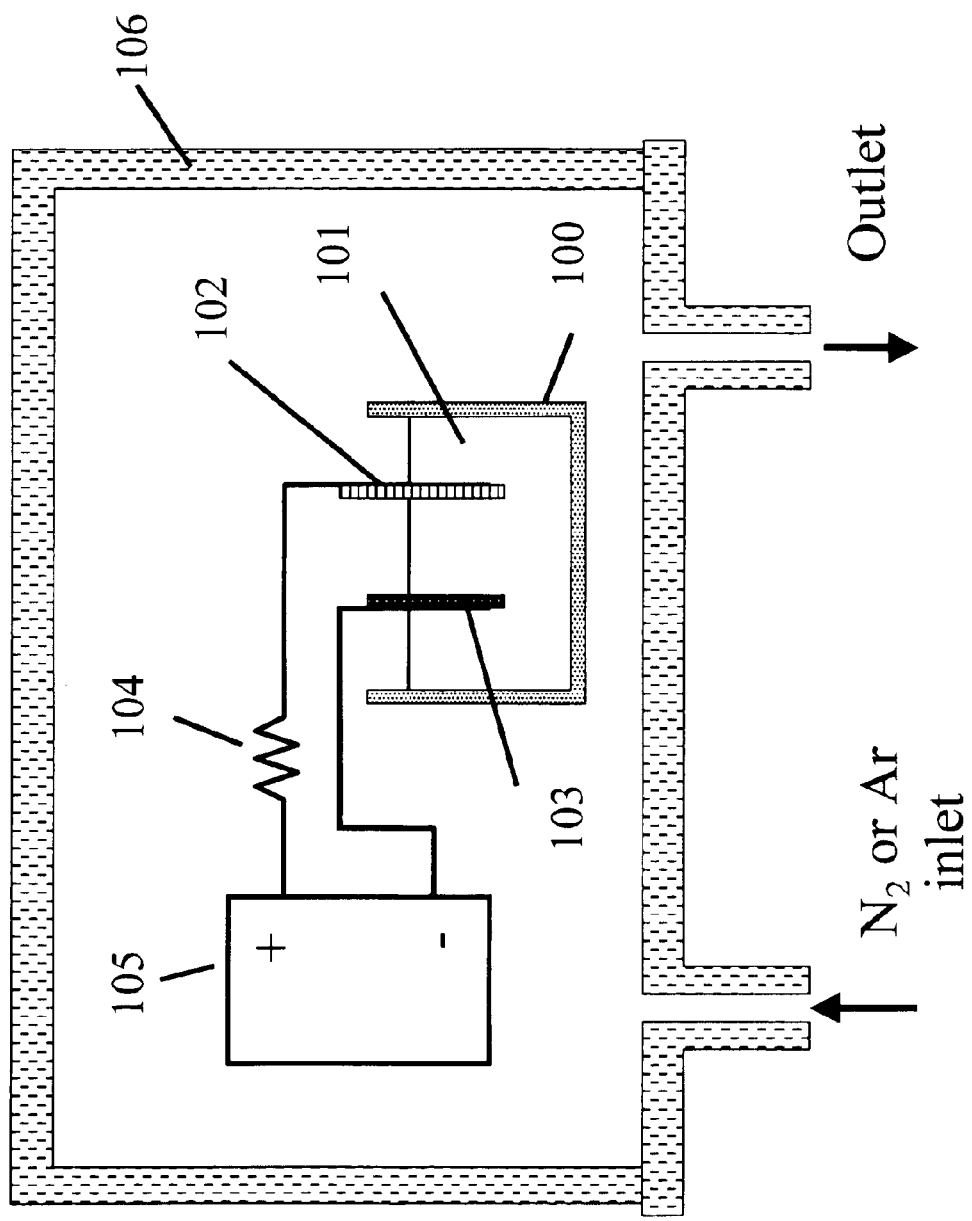
FIG. 1(*a*) is a schematic diagram showing electrodeposition of low work function metal layer on a substrate where
FIG. 1(b) shows a schematic cross-sectional view of individual layers in part of an organic device, including a first electrode formed by electrodeposition method.

FIG. 1(a) is a schematic diagram showing electrodeposition of low work function metal layer. In a glass container (100), an electrolyte (101) containing ions of the metal layer to be deposited is added. An anode (102) is partly immersed in the electrolyte (101) and is electrically connected to one end of a current sensing and limiting resistor (104). The other end of the resistor (104) is connected to the positive terminal of a dc voltage source (105). A cathode substrate (103) is electrically connected to the negative terminal of the dc voltage source (105). The cathode substrate (103) has a conductive seed layer such as indium tin oxide (ITO) and is partly immersed in the electrolyte (101). To minimize the unwanted oxidation of the low work function thin film layer to be deposited on the cathode substrate (103), the glass container (100) with the electrolyte (101), anode (102) and cathode substrate (103) is enclosed in a chamber (106). The chamber has an inlet and an outlet for inert gas such as $N_2$, Ar or a mixture of them. When the flow of inert gas is initiated, the oxygen or water vapour within the chamber (106) will be pushed out of the chamber (106) so that the chance of oxidation of the low work function layer is avoided. To initiate the electrodeposition of the low work function layer, the dc voltage source (105) is turned on so that a current is allowed to flow from the anode (102) through the electrolyte (101) to the cathode (103). Ions or complexes of the low work function material migrate from the anode (102) towards the cathode substrate (103) and deposit onto the cathode substrate surface. The deposition process will be allowed for a given period of time. After this, the cathode substrate (103) is withdrawn from the electrolyte (101) and immersed in a container containing acetone (not shown in the figure). The purpose of immersing the cathode substrate (103) with the deposited low work function layer into acetone is to dissolve the electrolyte adheres to the surfaces of the cathode substrate (103). The electrolyte may contain water and will lead to un-wanted oxidation or hydradation of the low work function layer. After the acetone immersing, the cathode substrate (103) may be spun-dried for subsequent fabrication processes.

Figure 1B:
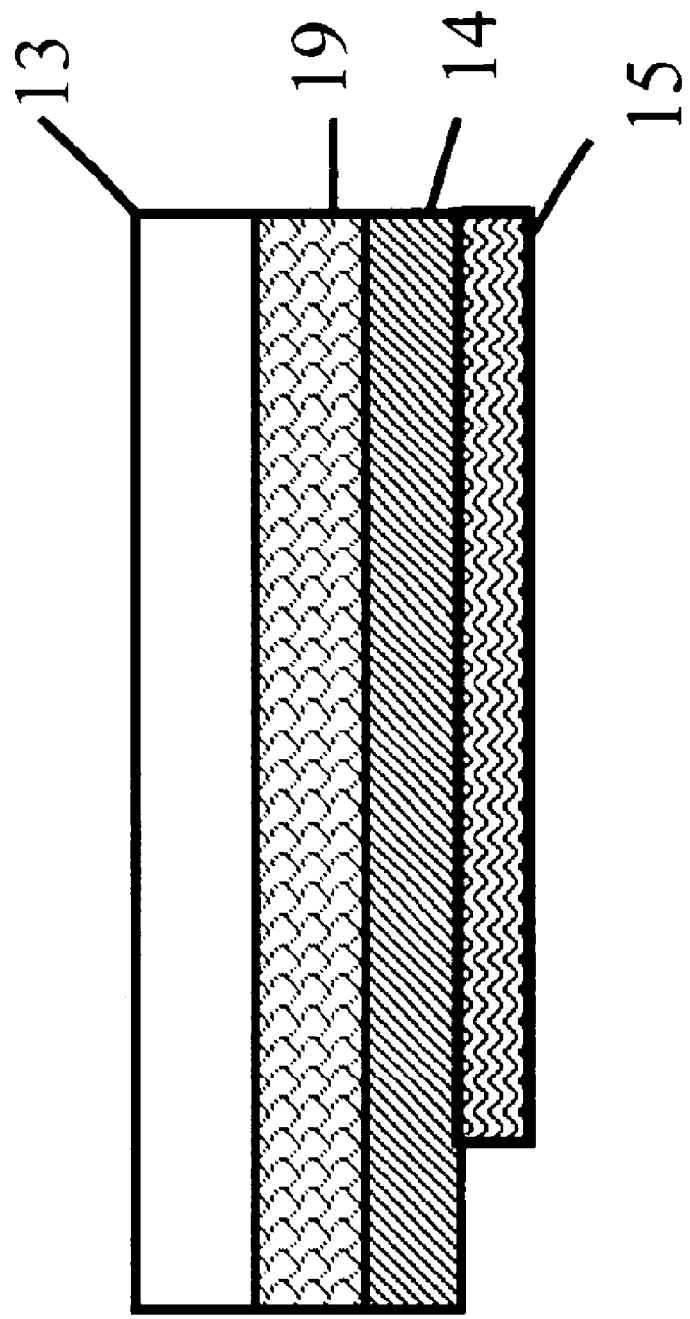

FIG. 1(b) shows a schematic cross-sectional view of individual layers in part of an organic device, including of an electrode formed by above-mentioned electrodeposition method, where (13) is the substrate, (19) is the optional seed layer, (14) is a first electrode layer, (15) is a layer of organic semi-conducting materials. As described earlier, the electrodeposition process starts from a substrate (13). This substrate (13) maybe selected from a group of rigid materials such as glass, alumina, aluminium, nickel, brass, stainless steel sheet, etc., or from a group of flexible materials such as polymeric sheets like polyester, polycarbonate, polyimide, and textile fabrics, etc. After a cleaning of the substrate surface, a conductive seed layer (19) is deposited on the front surface of the substrate (13). The seed layer (19) should have good adhesion to the substrate (13), good electrical conductivity and good thermal stability. Examples of the seed layer materials are: indium-tin oxide (ITO), zinc oxide, silver, gold, platinum, or alloys. It is clear that the selection of the seed layer (19) is depending on the type of substrate (13) and the exact process of the deposition used. The deposition of the seed layer (19) may be achieved by vacuum deposition such as evaporation, sputtering and chemical vapour deposition. However, it may preferably be carried out by an electroless deposition method according to this invention. More preferably, the substrate (13) is selected so that it can serve as the seed layer (19) as well. Possible substrate materials include: brass, stainless steel, nickel, platinum or alloys. The preferred thickness of the seed layer (19) is in the order of 0.1 $\mu$m to about 1 $\mu$m when a substrate (13) is adopted and is in the order of 20 $\mu$m to 500 $\mu$m when a separate substrate (13) is not employed.

After the selection of the substrate (13) or/and the deposition of the seed layer (19), a photolithographic process maybe carried out to define the patterns for the devices. After the pattern formation of the seed layer (19), a layer of first electrode (14) is deposited onto the seed layer (19) by electrodeposition.

The electrodeposition of low work functional material may be carried out in an aqueous solution but preferably in an organic solution. The low work function materials include: Mg, Ca, Li or a mixture of them or a mixture of one of the above low work function materials with another metallic materials such as aluminium or silver. Since the low work function materials are rather re-active and can readily react with oxygen or water molecules to form oxides or hydrides, according another embodiment of this invention, it is preferred to carry out the electrodeposition of the top electrode layer in an environment containing an inert atmosphere such as Ar, $N_2$ or the mixture of them as exampled in FIG. 1(a). A reduction agent such as $H_2$ may be added to the inert atmosphere to minimize further the oxygen and water contamination. The concentration of the reduction agent added may be in the order of 1% but can be as high as 10%.

More importantly according to this invention after the construction of the low work function first electrode (14), at least a layer of organic semiconductor materials (15) is then immediately applied onto the front surface of this electrode (14). The selection of organic materials, either small molecules or macromolecules, is dependent on the function of device to be fabricated. The layer or layers of organic semiconductor materials should have electronic or electro-opto functions, such as electron injection, electron transport, hole block, electron-hole recombination, light emitting, and others, required for the desired device, and also should prevent the low work function electrode from oxidization. The applying method of the organic materials (15) onto the front surface of the electrode (14) would depend on the organic materials (15) selected, any conventional solution processing technique including spin coating, ink jet printing, screen printing, thermal transfer printing, spray, dip-coating etc. could be used.

Figure 2:
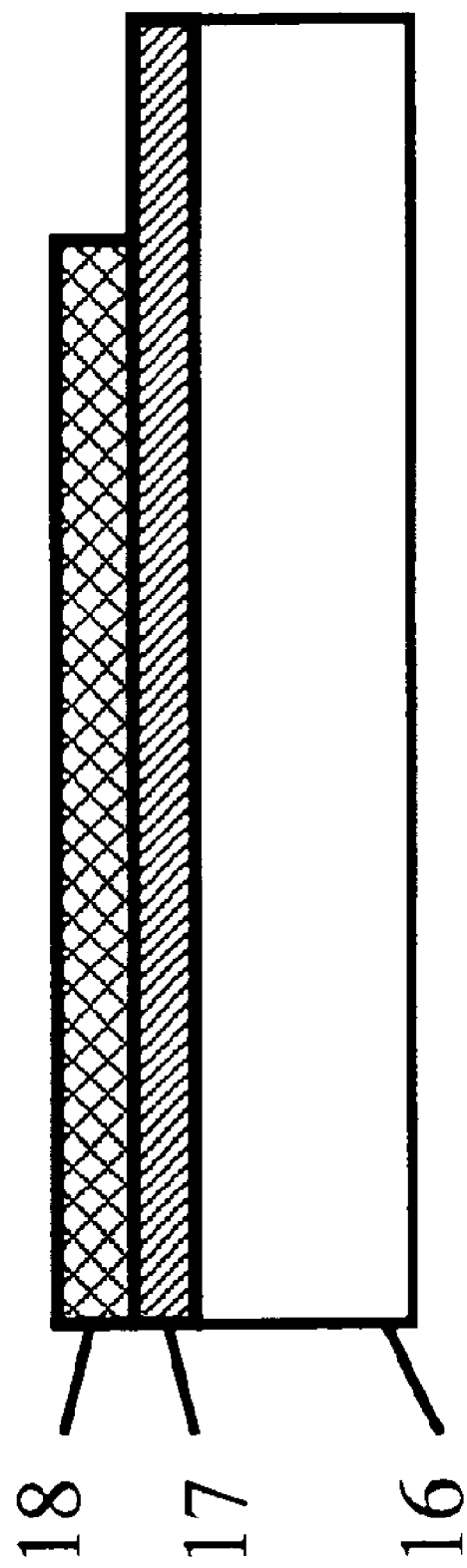
FIG. 2 shows a schematic cross-sectional view of individual layers in part of an organic device, including a second electrode formed by solution processing techniques, including screen-printing, ink jet printing, spin coating, and thermal transfer printing.

The high work function electrodes (17), shown in FIG. 2. can be fabricated by the above-mentioned electrodeposition method as well, where a seed layer (not shown) is needed. However, according to another embodiment of this invention, the high work function electrodes (17) are preferably to be formed by solution processing techniques, more preferably from nano-particle materials in a solution or dispersion. The deposition and patterning of these materials may be performed by screen-printing, ink jet printing, spin coating, thermal transfer printing etc. The preferable high work function materials include conductive inks containing silver, or gold, or other metallic particles, ITO inks, ZnO inks, and others. For OLED application, transparent and electrically conductive nano-particles of ITO in solution are more preferable.

As shown in FIG. 2, after the deposition of high work function materials (17) on a substrate (16), a thermal or chemical treatment may be performed in order to stabilize and clean the electrode (17). More preferably, at least a layer of semiconducting organic material (18) is subsequently deposited on top of this high work function electrode (17). This layer (18) or these layers of semi-conducting organic materials shall provide the functionality, such as hole injection, hole transport, electron block, hole-electron combination etc, desired by the final device, and also shall prevent the high work function electrode from corrosion or degradation.

Figure 3:
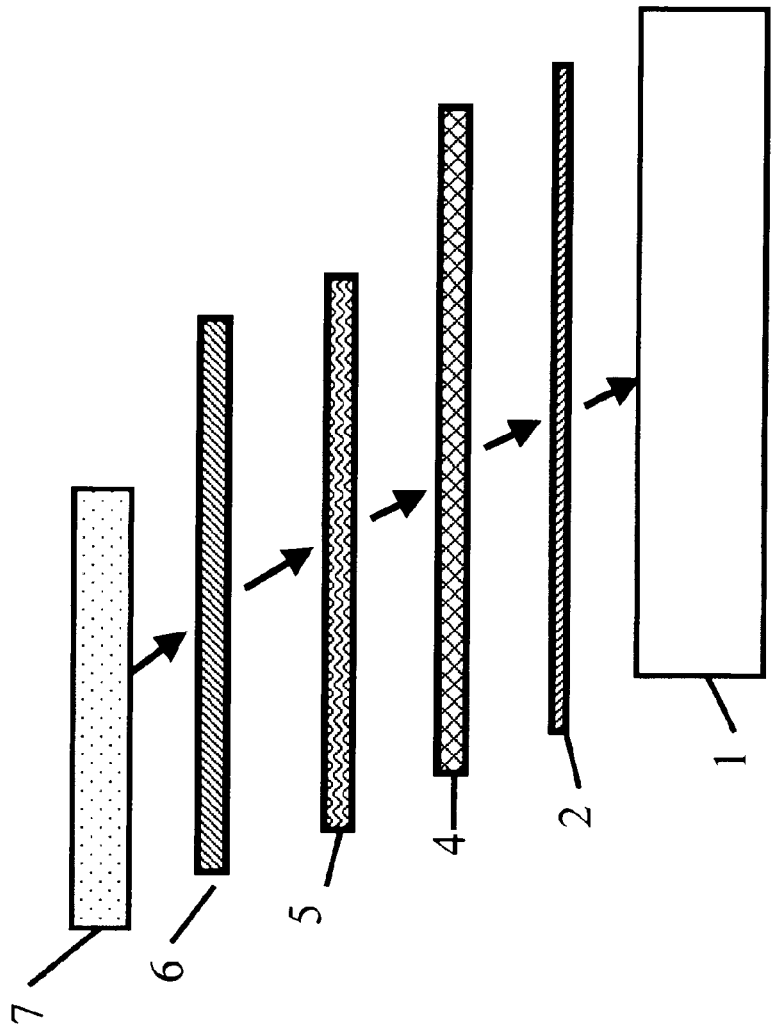
FIG. 3 shows a schematic cross-sectional view of individual layers of an organic device deposited by using the conventional (bottom-up) method under a vacuum environment.

As introduced earlier, the semiconducting organic materials based devices are currently built in a sequence from anode to cathode under vacuum environment as schematically shown in FIG. 3. Take the fabrication of a typical PLED as an example. Firstly, a transparent electrode (2), usually indium-doped tin oxide (ITO) is vacuum sputtered on a glass substrate (1). Secondly, a hole-transport layer (4) such as poly (3,4-ethylene-dioxythiophene) (PEDOT) is coated onto the layer (2). Thirdly, a layer of light emitting polymer (5) such as poly[2-methoxy-5-(2-ethylhexyloxy)-1,4-phenylenevinylene] (MEH-PPV) is coating onto the layer (4), fourthly a top electrode (6) such as barium is thermally evaporated on layer (5) through a shadow mask. Finally, a protective layer (7) such as aluminium is deposited. The above fabrication steps yield a standard polymer light-emitting device with a layer structure of Glass/ITO/PEDOT/MEH-PPV/Ba/Al. The polymer (5) is commonly applied by spin coating or ink-jet printing, while the electrodes (2, 6) are usually constructed by vacuum deposition or sputtering. Therefore, in this sequential fabrication process, both wet processes and dry processes are often required. One major drawback of this sequential fabrication is the requirements to integrate the wet processes and the dry processes, with total different working environments, into a single fabrication chamber.

According to one embodiment of this invention, two distinguished approaches are disclosed for the fabrication of an organic semiconductor device under completely non-vacuum environment.

Figure 4:
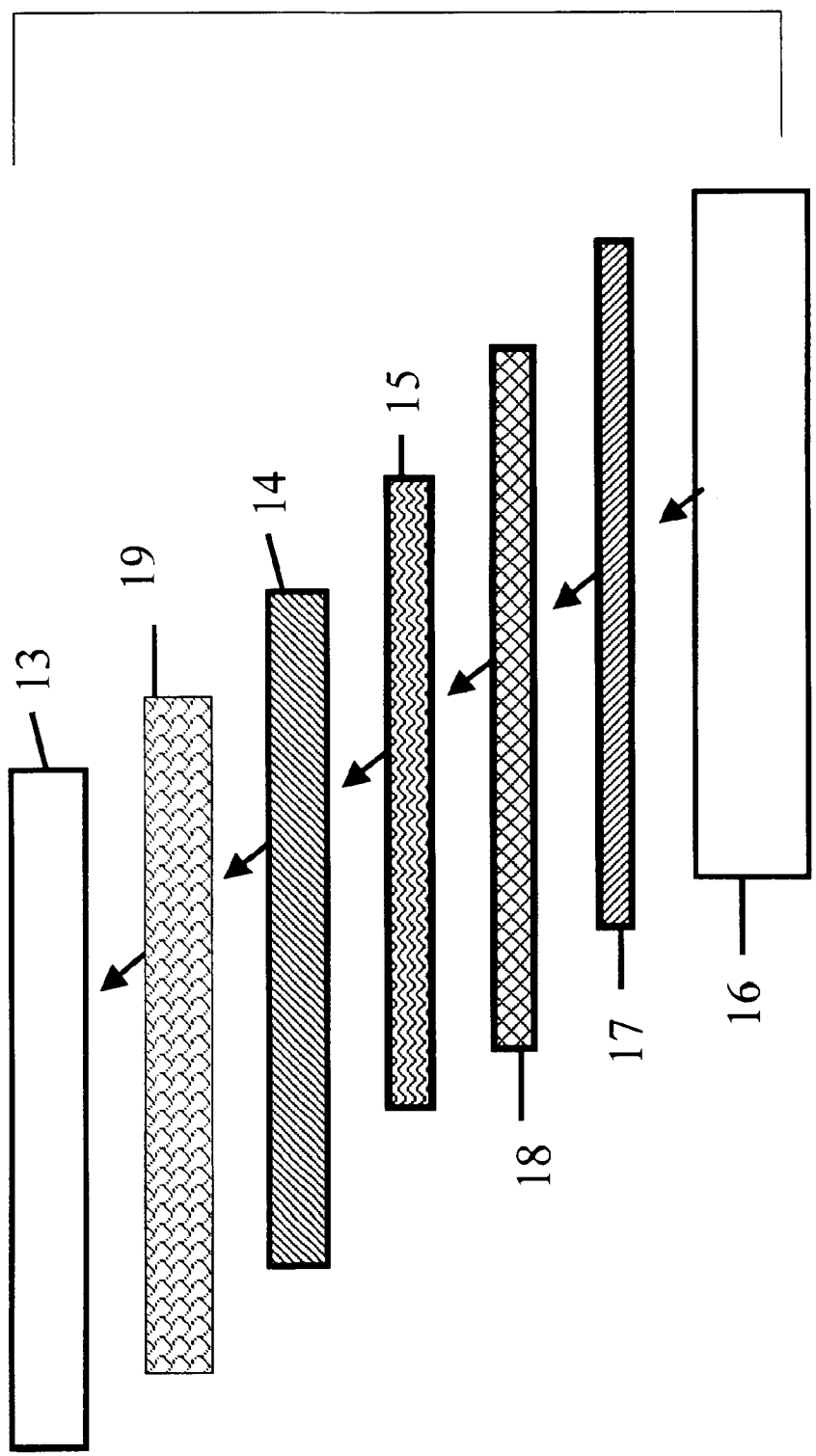
FIG. 4 shows a schematic cross-sectional view of individual layers of an organic device (10) deposited using the reverse (top-down) fabrication method (LBL mode in this invention) under a non-vacuum environment.

In one approach, a semiconductor device (10) is built in a layer-by-layer manner as shown schematically in FIG. 4. The sequence is from cathode to anode, which is opposite to that adapted by the conventional method (compared to FIG. 3). In other words, the device (10) has an inverted device structure. Although the device (10) is still built in a layer-by-layer manner, this inventive approach makes all layers including both electrode layers to be fabricated under non-vacuum environment. First, an conducting seed layer (19) is deposited on the first substrate (13). A low work function first electrode (14) or a cathode is then constructed by electrodeposition method as detailed above in this invention. After this, all of the necessary organic layers (15 and/or 18.) are successively applied onto this low work function first electrode (14) by solution processing. Finally, a high work function electrode (17) is deposited onto the organic semiconductor layer (18) with another non-vacuum processing technique, either electrodeposition or solution processing, as detailed above in this invention. A protective layer (16) may be further deposited on this high work function second electrode (17) to form the final device (10) by coating or with the assistance of adhesives. In this invention, we refer this approach as the "layer by layer (LBL)" mode.

Figure 5:
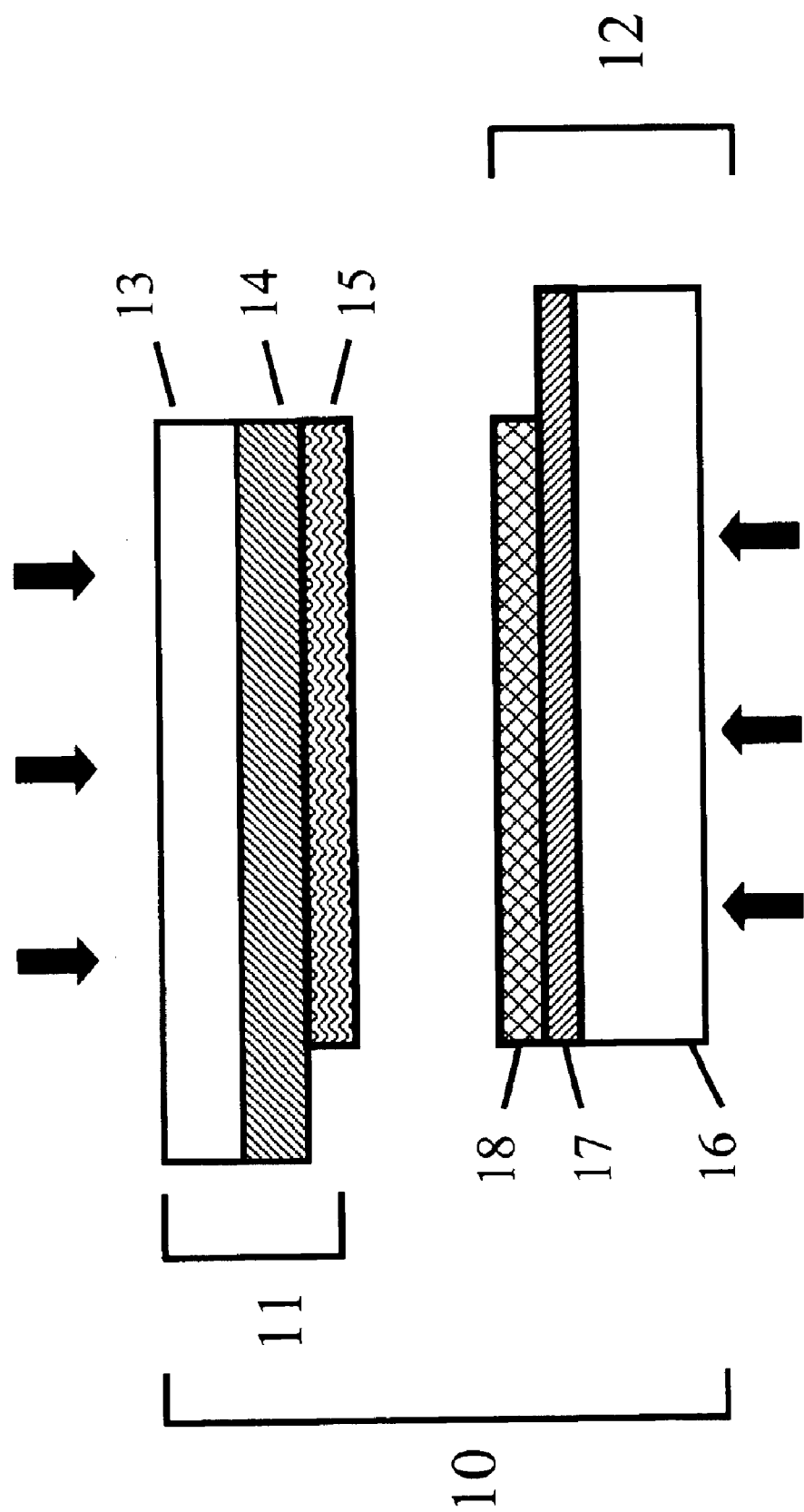
FIG. 5 shows a schematic diagram of an organic device (10) constructed by combining two parts according to this invention (LTL mode in this invention), each part is fabricated in a separate manner under a non-vacuum environment.

According to another approach of this invention, as shown in FIG. 5, a semiconductor device (10) is constructed by combining (or assembling) a first part (11) and a second part (12) together. The first part (11) consists of a first substrate (13), a low work function first electrode (14) and at least one layer of a first organic semiconductor material (15). The first electrode (14) may be fabricated using a low working material to form a cathode, which is preferably deposited by electrodeposition according to this invention. The second part (12) of the device may be constructed by applying onto a second substrate (16'), a high work function second electrode (17), which could be commercially available one or the one constructed by a non-vacuum processing technique according to this invention with at least a layer of second organic semiconductor material (18) by using solution processing technique. The organic device (10) is finally obtained by combining the first part (11) with the second part (12) under controlled environment. In this invention, we refer this later scheme as the "layer to layer (LTL)" mode.

According to LTL mode, the second organic material (18) on the second part (12) and the first organic material (15) on the first part (11) can be the same or different materials. More preferably, they can cross-link to each other by heating or irradiation. The purpose of cross-linking between two parts (11, 12) is to form an integral organic semiconductor device (10) and increase the evenness of the interface of two parts.

For either LBL mode or LTL mode, there is eventually no limitation to the selection of substrates, the selection of electrode materials, and the selection of semiconductor materials for each layer. Flexible substrates would offer the flexibility of the final devices and also provide the possibility of roll-to-roll mass production. For the use of solution processing technique to deposit and pattern semiconductor layers, electro-opto active polymers are preferable.

A combination of substrates, electrode materials, semiconductor materials for each layer would define the function of the final devices. The organic semiconductor devices which may be fabricated according to this invention include but not limited to organic thin film transistor (OTFT), organic photo-voltaic (OPV) for solar cell application or detection, organic solid state laser or organic solid state lighting (OSSL), organic thin film memory (OTFM) for data storage, organic sensor (OS) for bio-application and chemical detection, organic light emitting diode (OLED) for flat panel applications and others.

Without the requirement of vacuum for the entire processing of a semiconductor device, the methods provided in this invention will make the processing to be easy. In addition, the methods will allow low cost equipment to be set-up and to maintain. Hence, the methods disclosed here will offer the simplicity for large-scale production.

In the subsequent part of the patent, some examples on the electrodeposition of metallic layers and the fabrication of PLEDs are given. It is clear that these examples are presented for illustration purposes and not presented to limit the scope of this invention.

EXAMPLES

Example 1

Electrodeposition of Mg Thin Films From an Aqueous Solution

Referring to FIG. 1(a), an electrolyte solution (101) containing 0.1 M of $MgCl_2$ in de-ionized water is prepared at room temperature and contained in a glass beaker (100). A platinum sheet (102) is immersed in the electrolyte and used as the anode for the deposition. A glass slide with a layer of pre-coated indium tin oxide (ITO) is used as the cathode substrate (103). The ITO layer may be coated by a vacuum deposition method such as evaporation, sputtering and chemical vapour deposition. The ITO layer also may be preferably coated by a non-vacuum method such as electroless deposition. For the deposition of the Mg thin films, the electrolyte solution, the anode and the cathode are enclosed in a chamber (106) with flowing inert gas such as nitrogen, argon or the mixture of them. In order to reduce further the oxygen contents in the chamber, a small amount of hydrogen may be added to the inert gas or mixture of the inert gases.

A dc voltage source (105) is connected between the anode and cathode with the voltage adjusted to about 4 volts via a current sensing and limiting resistor (104). The glass cathode substrate is then immersed in the electrolyte to initiate the electrodeposition. The deposition is allowed for a period of 60 seconds and the ITO-coated glass cathode substrate is withdrawn from the electrode and immersed immediately in a first acetone to dissolve the water and to minimize the un-wanted oxidation of the electrodeposited Mg films. The sample may preferably be removed from the first acetone and immersed immediately into a second acetone to minimize the water contamination. The sample can now be removed from the second acetone and spun dry. During the spinning, it is preferable to carry out the process in the chamber with flowing inert gas or mixture.

Thickness of the Mg film obtained is in the order of 400 nm.

Figure 6:
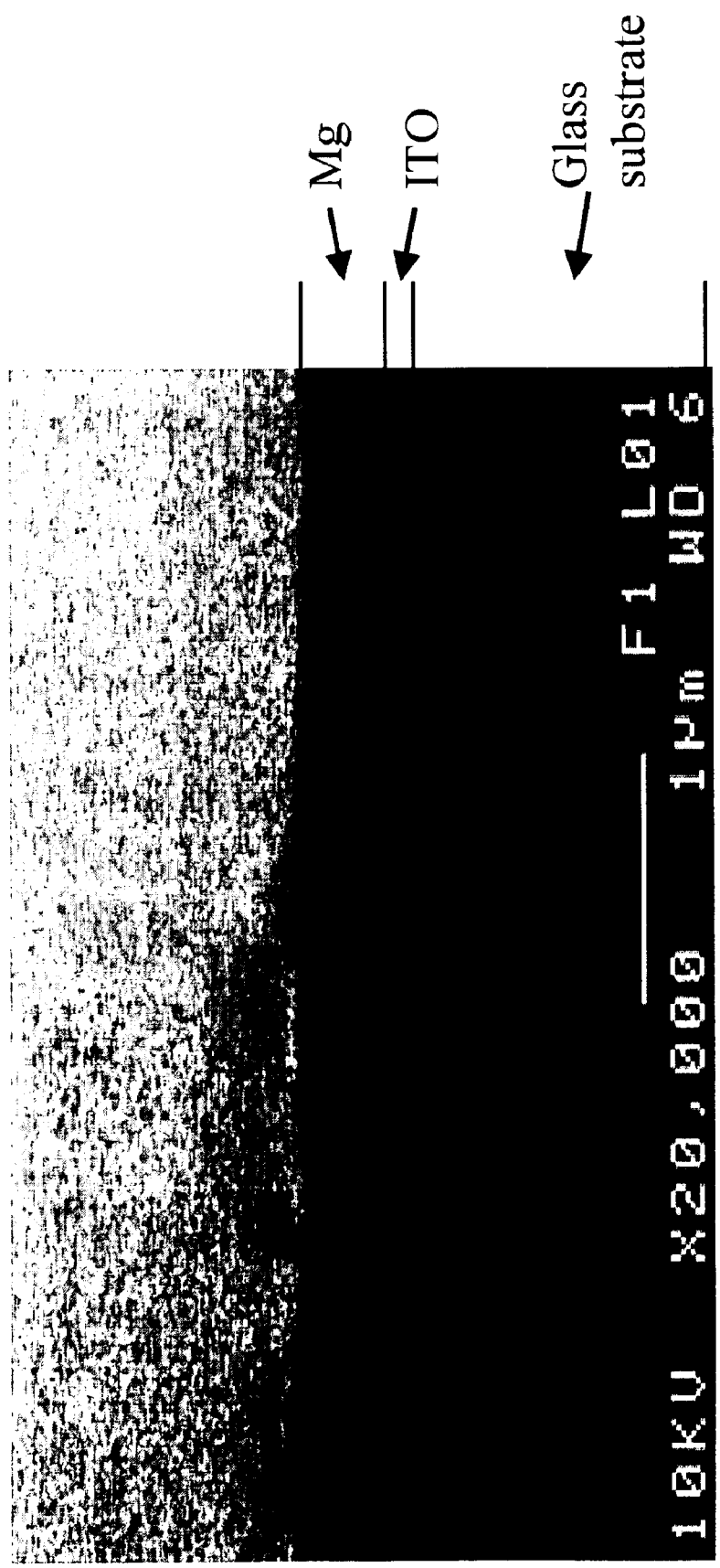
FIG. 6 presents a SEM image of an electrodeposited Mg thin film on an ITO-coated glass substrate.

FIG. 6 presents a SEM image of Mg on ITO-coated glass substrate, where ITO on the glass substrate acts as the seed layer and Mg is electrodeposited from an electrolyte solution containing 0.1 M of $MgCl_2$ in de-ionized water according to the above procedure. The deposition conditions are: current density: 2 $mA/cm^2$, deposition time:40 seconds. It is noted that thickness of the electrodeposited Mg layer is about 300 nm.

According to this invention, in order to reduce further the oxygen content in the electrodeposited Mg films with low work function, a heat treatment in a reduction atmosphere is carried out. This is carried out by putting the samples in a chamber with a mixture of Ar and $H_2$ at a temperature below the melting point of the low work function material. The preferred heat treatment time is from 10 minutes to about 2 hours. After the above electrodeposition and treatment. The substrate with the low work function thin film is ready for subsequent processing of organic semiconductor devices. For example, a semiconductor polymer layer can be coated onto the surface of this low work function thin film to make organic semiconductor device and to protect the low work function metal layer.

To facilitate the electrodeposition of low work function materials for organic semiconductor devices, according to another embodiment of this invention, a conductive seed layer is first deposited on the substrate. The material of the seed layer preferably should be chemically stable and with relatively high melting and with good adhesion to the substrate. Hence, it is clear that the selection of seed layer will depend on the substrate materials used.

Example 2

Electrodeposition of Mg Thin Films From a Non-Aqueous Solution

In a chamber with flowing inert gas such as nitrogen, argon or the mixture of them, a non-aqueous electrolyte solution is prepared as follows. In a 500 ml flask containing 200 ml of 1.5M of diethyl magnesium (0.3 mol.) in diethyl ether, 68.4 g of triethyl aluminium (0.6 mol.) and 57.9 g of triisobutyl aluminium (0.3 mol.) were added. The mixture was slowly heated to boil off most of the ether solvent, then 60 ml of toluene was added to the flask, the mixture was further slowly heated to boil off the remaining ether. After cooling to room temperature, 22.8 g of caesium fluoride was slowly added to the resulting toluene solution, and the mixture was then heated and stirred to form the complex salts that are the conductive species of the electrolyte.

Under moderate agitation at 40° C., a platinum sheet is immersed in the electrolyte and used as the anode for the deposition. A brass panel is immersed in the electrolyte and used as the cathode substrate. A dc voltage source is connected between the anode and cathode with the voltage adjusted to 3 volts. The deposition is allowed for a period of 8 minutes and the brass substrate is withdrawn from the electrode and washed thoroughly with diethyl ether. A shiny layer of magnesium with a thickness of about 0.4 $\mu$m is formed on the surface of brass panel after washing with acetone and drying in nitrogen.

Immediately after the above-described deposition of the first low work function electrode layer, a layer of semiconducting polymer is spin coated onto the sample surface. In this example, a layer of MEH-PPV is coated from a 1% wt./v of MEH-PPV in toluene at 2000 rpm. A low temperature heat treatment of the sample with the semiconducting polymer is now carried out to minimize the amount of solvent trapped within the polymer and to improve the molecule arrangement within the film. The heat treatment may be carried out in an inert atmosphere at a temperature in a range of 80° C. to 120° C., for a period from 30 minutes to about 120 minutes, depending on the type of polymer used. The above process completes the first part of an organic semiconductor device that consists of a cathode under coated by a semiconductor polymers, i.e, Cu/Mg/MEH-PPV

Example 3

Screen Printing ITO

A suspension containing ITO nono-particle (~10 nm) in cyclohexanol was used as ink to screen print and pattern a layer of ITO onto a glass substrate. Then, the solvent cyclohexanol was carefully removed by heating. Further thermal treatment at a temperature of about 250° C. in air was performed to stabilize ITO pattern. Then, a layer of PEDOT was spin coated onto ITO pattern from a commercial available PEDOT solution. Solvent and water from PEDOT solution were again removed by baking. Finally, a layer of MEH-PPV was spun coated onto PEDOT layer; this forms the second part of a PLED device with a layer structure of MEH-PPV/PEDOT/ITO/Glass.

Example 4

The Construction of a PLED Via "LTL" Mode

Example 2 provides the first part of PLED that consists of a cathode under coated by a semiconductor polymers i.e., Cu/Mg/MEH-PPV. Example 3 provides the second part of a PLED with a layer structure of MEH-PPV/PEDOT/ITO/Glass.

A PLED device is then fabricated by stacking the first part with the second part with a final device structure of Glass/ITO/PEDOT/MEH-PPV/Mg/Cu. To have a better interface contact between the two parts, the two parts may be pressed while being heated at a temperature ranging from 80 to 120° C. for a period of 5–20 minutes. More preferably, the two parts may be subjected to an electron-beam radiation in a compact electron-beam processor under dry nitrogen atmosphere. The electron-beam radiation may induce the cross-linking of MEH-PPV polymers via the formation of free radicals from aliphatic side groups.

Example 5

The Construction of a PLED Via "LBL" Mode

Followed a sample prepared according to example 2 with a layer structure of Cu/Mg/MEH-PPV, a layer of PEDOT is coated on the surface by the conventional spin coating method. A proper heat treatment is given in order to remove the solvent. At this stage, a transparent and conducting layer of ITO is applied on top of the PEDOT to serve as the second contact electrode (anode). In this example, 15% of nanoparticles of ITO dispersed in alcohol is applied by a screen-printing method. A conventional encapsulation with epoxy resin and glass is finally carried out. This completes the PLED with a final structure of Glass/ITO/PEDOT/MEH-PPV/Mg/Cu same as that illustrated in example 4.

Example 6

A PLED Device with Both Electrodes Fabricated by Electrodeposition

Followed a sample prepared according to example 2 with a layer structure of Glass/ITO/Mg/MEH-PPV, a layer of PEDOT is coated on the surface by the conventional spin coating method. A proper heat treatment is given in order to remove the solvent from PEDOT layers. Finally, a thin layer of nickel with a thickness not more than 200 nm was again deposited onto PEDOT layer via electrodeposition from an aqueous $NiSO_4$ solution. A conventional encapsulation with epoxy resin and a glass plate is finally carried out. This completes the PLED with a final structure of Glass/Ni/PEDOT/MEH-PPV/Mg/ITO/glass.

What is claimed is:

1. A process for the fabrication of an electronic and opto-electronic device with an inverted device structure based on organic semiconductors comprising the steps of: first forming a conducting substrate; then forming a first low work function electrode layer on a conducting substrate using an electrodeposition technique;

forming at least one organic semiconductor material layer on a first electrode; and forming a second high work function electrode layer on one organic material.

2. A process as defined in claim 1 wherein said electrodeposition may be carried out in either aqueous phase or organic phase.

3. A process as defined in claim 1 wherein said second high work function electrode layer is formed using solution processing techniques including thermal transfer printing, spray and screen printing.

4. A process as defined in claim 1, wherein deposition of said first low work function electrode layer is performed in an electrodeposition unit, said electrodeposition unit being enclosed in a closed chamber containing an inert gas and a reduction agent.

5. A process as defined in claim 1, further comprising a step of post-deposition treatment on said first and second electrode layers in a reducing atmosphere in order to minimize contents of oxygen and water.

6. A process as defined in claim 1 wherein said organic semiconductor layer is formed using solution processing techniques including spin coating, screen printing, thermal transfer printing, spray and dip-coating.

7. A process as defined in claim 1 further comprising a step of forming said device in a "layer to layer" mode by combining a first part and a second part. Said first part consisting of the first electrode coated with at least a layer of a first organic semiconductor material, said second part consisting of the second electrode coated with at least a layer of a second organic semiconductor material. Said first part and second part being constructed separately and assembled by aligning and sticking said first part onto said second part, and sticking of said no first part to second part is achieved by cross-linking said first organic semiconductor layer and said second organic semiconductor layer with assistance of heating, light or electron radiation.

8. A process as defined in claim 1, wherein said organic electronic and opto-electronic device with an inverted device structure being selected from a group of: organic light emitting diode, organic thin film transistor, organic solar cell, organic photodiode, organic memory chip, organic electronic circuit, and organic sensor.

* * * * *